United States Patent
Oberman et al.

[19]

[11] Patent Number: 5,918,062
[45] Date of Patent: Jun. 29, 1999

[54] MICROPROCESSOR INCLUDING AN EFFICIENT IMPLEMENTION OF AN ACCUMULATE INSTRUCTION

[75] Inventors: Stuart F. Oberman, Sunnyvale; Norbert Juffa, San Jose, both of Calif.

[73] Assignee: Advanced Micro Devices, Inc., Sunnyvale, Calif.

[21] Appl. No.: 09/014,507

[22] Filed: Jan. 28, 1998

Related U.S. Application Data

[60] Provisional application No. 60/063,601, Oct. 23, 1997.

[51] Int. Cl.[6] .............................. G06F 7/50; G06F 9/302; G06F 9/40
[52] U.S. Cl. ............................... 395/800.07; 395/800.06; 395/563; 395/900.05; 364/748.01
[58] Field of Search ...................... 395/800.04, 700.21, 395/800.07, 200.34, 800.2, 800.42, 800.06, 800.05, 570, 563; 364/754.03, 726.07, 715.04, 748.11, 748.01; 711/141, 220

[56] References Cited

U.S. PATENT DOCUMENTS

| | | | |
|---|---|---|---|
| 4,769,779 | 7/1988 | Chang et al. | 364/954.03 |
| 4,791,555 | 12/1988 | Garcia et al. | 395/800.61 |

*Primary Examiner*—Daniel H. Pan
*Attorney, Agent, or Firm*—Conley, Rose & Tayon, PC; B. Noel Kivlin

[57] ABSTRACT

An execution unit configured to perform a plurality of arithmetic operations using the same set of operands. These operands include corresponding input vector values in each of a plurality of input registers. The execution unit is coupled to receive these input vector values, as well as an instruction value indicative of one of the plurality of arithmetic operations. In one embodiment, the plurality of arithmetic operations includes a vectored add instruction, a vectored subtract instruction, a vectored reverse subtract instruction, and an accumulate instruction. The vectored instructions perform arithmetic operations concurrently using corresponding values from each of the plurality of input registers. The accumulate instruction, however, is executable to add together all input values within a single input register. The execution unit further includes a multiplexer unit configured to selectively route the input vector values to a plurality of adder units according to the opcode value. In an embodiment in which the execution unit is configured to perform subtraction operations as well as addition, the multiplexer unit is additionally configured to selectively route negated versions (either one's or two's complement format) to the plurality of adder units. Each of the plurality of adder units is configured to generate a sum based upon the values conveyed from the multiplexer unit. The accumulate instruction advantageously allows important operations such as the matrix multiply to be performed rapidly. Because the matrix multiply is an integral part of many applications (particularly graphics applications), the accumulate instruction may lead to increased overall system performance.

31 Claims, 8 Drawing Sheets

FIG. 1

PFACC

| mnemonic | opcode/imm8 | description |
---
| PFACC mmreg1,mmreg2/mem64 | 0Fh 0Fh / AEh | Floating-point accumulate |

100 ↙ (arrow to table)
102A ↗ (PFACC), 102B ↗ (mmreg2/mem64)
101 ↖ (0Fh)

FIG. 2A

```
mmreg1[31:0] = mmreg1[31:0] + mmreg1[63:32]
mmreg1[63:32] = mmreg2/mem64[31:0] + mmreg2/mem64[63:32]
```

PFSUB

| mnemonic | opcode/imm8 | description |
|---|---|---|
| PFSUB mmreg1,mmreg2/mem64 | 0Fh 0Fh / 9Ah | Packed floating-point subtraction |

FIG. 3A

```
mmreg1[31:0] = mmreg1[31:0] - mmreg2/mem64[31:0]
mmreg1[63:32] = mmreg1[63:32] - mmreg2/mem64[63:32]
```

FIG. 3B

PFSUBR

/ 300

| mnemonic | opcode/imm8 | description |
| --- | --- | --- |
| PFSUBR mmreg1,mmreg2/mem64 | 0Fh 0Fh / AAh | Packed floating-point reverse subtraction |

```
mmreg1[31:0] = mmreg2/mem64[31:0] - mmreg1[31:0]
mmreg1[63:32] = mmreg2/mem64[63:32] - mmreg1[63:32]
```

PFADD

| mnemonic | opcode/imm8 | description |
|---|---|---|
| PFADD mmreg1,mmreg2/mem64 | 0Fh 0Fh / 9Eh | Packed floating-point addition |

400 ← (arrow to table)
402A → PFADD mmreg1
402B → mmreg2/mem64
401 ← 0Fh 0Fh / 9Eh

FIG. 5A

```
mmreg1[31:0]  = mmreg1[31:0]  + mmreg2/mem64[31:0]
mmreg1[63:32] = mmreg1[63:32] + mmreg2/mem64[63:32]
```

MICROPROCESSOR INCLUDING AN
EFFICIENT IMPLEMENTION OF AN
ACCUMULATE INSTRUCTION

PRIORITY CLAIM

This application claims the benefit of U.S. Provisional Application No. 60/063,601, entitled Method and Apparatus for Multifunction Arithmetic, filed Oct. 23, 1997.

BACKGROUND OF THE INVENTION

1. Field of the Invention

This invention relates to computer systems and microprocessors, and more particularly to a multimedia execution unit incorporated within a microprocessor for accommodating high-speed multimedia applications. The invention further relates to an accumulate function and vector processing implemented within microprocessor-based systems.

2. Description of the Related Art

Microprocessors typically achieve increased performance by partitioning processing tasks into multiple pipeline stages. In this manner, microprocessors may independently be executing various portions of multiple instructions during a single clock cycle. As used herein, the term "clock cycle" refers to an interval of time during which the pipeline stages of a microprocessor perform their intended functions. At the end of the clock cycle, the resulting values are moved to the next pipeline stage.

Microprocessor based computer systems have historically been used primarily for business applications, including word processing and spreadsheets, among others. Increasingly, however, computer systems have evolved toward the use of more real-time applications, including multimedia applications such as video and audio processing, video capture and playback, telephony and speech recognition. Since these multimedia applications are computational intensive, various enhancements have been implemented within microprocessors to improve multimedia performance. For example, some general purpose microprocessors have been enhanced with multimedia execution units configured to execute certain special instructions particularly tailored for multimedia computations. These instructions are often implemented as "vectored" instructions wherein operands for the instructions are partitioned into separate sections or vectors which are independently operated upon in accordance with the instruction definition. For example, a vectored add instruction may include a pair of 32-bit operands, each of which is partitioned into four 8-bit sections. Upon execution of such a vectored add instruction, corresponding 8-bit sections of each operand are independently and concurrently added to obtain four separate and independent addition results. Implementation of such vectored instructions in a computer system furthers the use of parallelism, and typically leads to increased performance for certain applications.

Vectored arithmetic operations such as add and subtract are useful for a variety of multimedia operations. As mentioned above, however, these operations are performed on corresponding portions of different operands. It would also be desirable to have an instruction which performs an addition operation using portions of the same operands. Such an instruction (referred to herein as an "accumulate instruction") would be useful in sum-of-product calculations which are part of the matrix multiply operation commonly used in multimedia applications. It would further be desirable to provide a multimedia execution unit with an efficient hardware implementation of the accumulate instruction.

SUMMARY OF THE INVENTION

The problems outlined above are in large part solved by an execution unit configured to perform an accumulate instruction in accordance with the present invention. In one embodiment, an execution unit is provided which is configured to perform a plurality of arithmetic operations using the same set of operands. These operands include corresponding input vector values in each of a plurality of input registers. The execution unit is coupled to receive these input vector values, as well as an instruction value indicative of one of the plurality of arithmetic operations.

In one embodiment, the plurality of arithmetic operations includes a vectored add instruction, a vectored subtract instruction, a vectored reverse subtract instruction, and an accumulate instruction. The vectored instructions perform arithmetic operations concurrently using corresponding values from each of the plurality of input registers. For example, in an embodiment with two input registers each including two vector input values, execution of the vectored add instruction would cause a first add operation to be performed using a first value in the first input register and a corresponding first value in the second input register. Additionally, execution of the add instruction would include a second add operation using a second value in the first input register and a corresponding second value in the second input register. The accumulate instruction, however, is executable to add together all input values within a single input register. For the example above (two input registers), an execution of the accumulate instruction would cause the two input values within the first input register to be added together to produce a first output value, with the two input values of the second input register being added together to produce a second output value.

The execution unit further includes a multiplexer unit configured to selectively route the input vector values to a plurality of adder units according to the instruction value. In an embodiment in which the execution unit is configured to perform subtraction operations as well as addition, the multiplexer unit is additionally configured to selectively route negated versions (either one's or two's complement format) to the plurality of adder units.

Each of the plurality of adder units is configured to generate a sum based upon the values conveyed from the multiplexer unit. If negative values are conveyed to the adder units in two's complement format, no correction is needed for the addends. If negative values are conveyed to the addends in one's complement format, however, an additional '1' value is added to the LSB of the result in some cases.

The accumulate instruction advantageously allows important operations such as the matrix multiply to be performed rapidly. Other operations benefit from this instruction as well. Because the matrix multiply is an integral part of many applications (particularly graphics applications), the accumulate instruction may lead to increased overall system performance.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
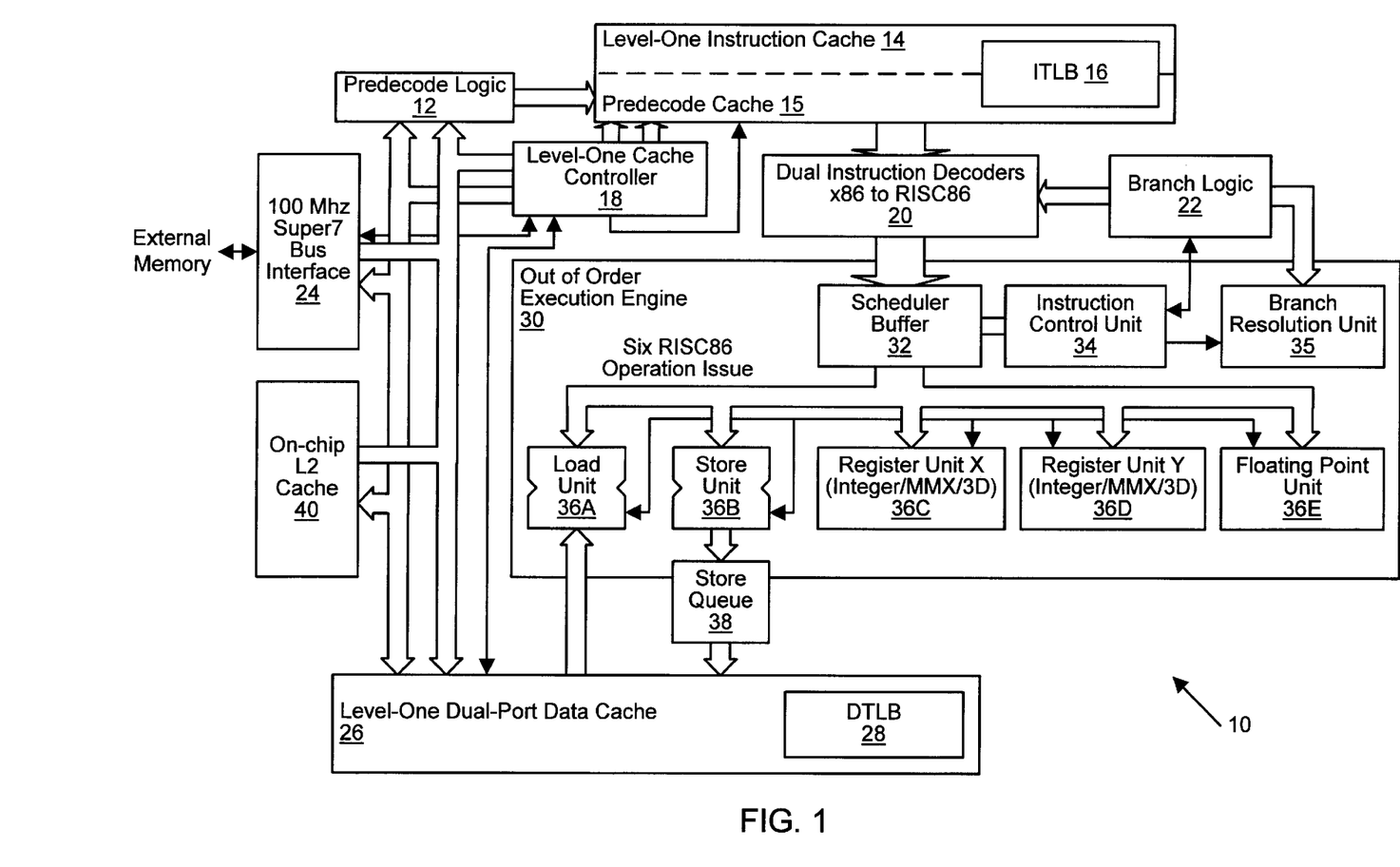
FIG. 1 is a block diagram of a microprocessor.

Turning now to FIG. 1, a block diagram of one embodiment of a microprocessor 10 is shown. As depicted, microprocessor 10 includes a predecode logic block 12 coupled to an instruction cache 14 and a predecode cache 15. Caches 14 and 15 also include an instruction TLB 16. A cache controller 18 is coupled to predecode block 12, instruction cache 14, and predecode cache 15. Controller 18 is additionally coupled to a bus interface unit 24, a level-one data cache 26 (which includes a data TLB 28), and an L2 cache 40. Microprocessor 10 further includes a decode unit 20, which receives instructions from instruction cache 14 and predecode data from cache 15. This information is forwarded to execution engine 30 in accordance with input received from a branch logic unit 22.

Execution engine 30 includes a scheduler buffer 32 coupled to receive input from decode unit 20. Scheduler buffer 32 is coupled to convey decoded instructions to a plurality of execution units 36A–E in accordance with input received from an instruction control unit 34. Execution units 36A–E include a load unit 36A, a store unit 36B, an integer X unit 36C, an integer Y unit 36D, and a floating point unit 36E. Load unit 36A receives input from data cache 26, while store unit 36B interfaces with data cache 26 via a store queue 38. Blocks referred to herein with a reference number followed by a letter will be collectively referred to by the reference number alone. For example, execution units 36A–E will be collectively referred to as execution units 36.

Generally speaking, multimedia execution unit 36D within microprocessor 10 is configured to provide an efficient implementation for an accumulate arithmetic instruction. As will be described in greater detail below, execution units 36C–D include multiplexer units which implement the accumulate instruction using the same hardware which implements similar vectored arithmetic operations. In this manner, execution units 36C–D advantageously implement the accumulate instruction as a dedicated, single-cycle, instruction, thereby increasing the performance of applications such as three-dimensional graphics rendering and audio processing.

In one embodiment, instruction cache 14 is organized as sectors, with each sector including two 32-byte cache lines. The two cache lines of a sector share a common tag but have separate state bits that track the status of the line. Accordingly, two forms of cache misses (and associated cache fills) may take place: sector replacement and cache line replacement. In the case of sector replacement, the miss is due to a tag mismatch in instruction cache 14, with the required cache line being supplied by external memory via bus interface unit 24. The cache line within the sector that is not needed is then marked invalid. In the case of a cache line replacement, the tag matches the requested address, but the line is marked as invalid. The required cache line is supplied by external memory, but, unlike the sector replacement case, the cache line within the sector that was not requested remains in the same state. In alternate embodiments, other organizations for instruction cache 14 may be utilized, as well as various replacement policies.

Microprocessor 10 performs prefetching only in the case of sector replacements in one embodiment. During sector replacement, the required cache line is filled. If this required cache line is in the first half of the sector, the other cache line in the sector is prefetched. If this required cache line is in the second half of the sector, no prefetching is performed. It is noted that other prefetching methodologies may be employed in different embodiments of microprocessor 10.

When cache lines of instruction data are retrieved from external memory by bus interface unit 24, this data is conveyed to predecode logic block 12. In one embodiment, the instructions processed by microprocessor 10 and stored in cache 14 are variable-length (e.g., the x86 instruction set). Because decode of variable-length instructions is particularly complex, predecode logic 12 is configured to provide additional information to be stored in instruction cache 14 to aid during decode. In one embodiment, predecode logic 12 generates predecode bits for each byte in instruction cache 14 which indicate the number of bytes to the start of the next variable-length instruction. These predecode bits are stored in predecode cache 15 and are passed to decode unit 20 when instruction bytes are requested from cache 14.

Instruction cache 14 is implemented as a 32 Kbyte, two-way set associative, writeback cache in one embodiment of microprocessor 10. The cache line size is 32 bytes in this embodiment. Cache 14 also includes a TLB 16, which includes 64 entries used to translate linear addresses to physical addresses. Many other variations of instruction cache 14 and TLB 16 are possible in other embodiments.

Instruction fetch addresses are supplied by cache controller 18 to instruction cache 14. In one embodiment, up to 16 bytes per clock cycle may be fetched from cache 14. The fetched information is placed into an instruction buffer that feeds into decode unit 20. In one embodiment of microprocessor 10, fetching may occur along a single execution stream with seven outstanding branches taken.

In one embodiment, the instruction fetch logic within cache controller 18 is capable of retrieving any 16 contiguous instruction bytes within a 32-byte boundary of cache 14.

There is no additional penalty when the 16 bytes cross a cache line boundary. Instructions are loaded into the instruction buffer as the current instructions are consumed by decode unit 20. (Predecode data from cache 15 is also loaded into the instruction buffer as well). Other configurations of cache controller 18 are possible in other embodiments.

Decode logic 20 is configured to decode multiple instructions per processor clock cycle. In one embodiment, decode unit 20 accepts instruction and predecode bytes from the instruction buffer (in x86 format), locates actual instruction boundaries, and generates corresponding "RISC ops". RISC ops are fixed-format internal instructions, most of which are executable by microprocessor 10 in a single clock cycle. RISC ops are combined to form every function of the x86 instruction set in one embodiment of microprocessor 10.

Microprocessor 10 uses a combination of decoders to convert x86 instructions into RISC ops. The hardware includes three sets of decoders: two parallel short decoders, one long decoder, and one vectoring decoder. The parallel short decoders translate the most commonly-used x86 instructions (moves, shifts, branches, etc.) into zero, one, or two RISC ops each. The short decoders only operate on x86 instructions that are up to seven bytes long. In addition, they are configured to decode up to two x86 instructions per clock cycle. The commonly-used x86 instructions which are greater than seven bytes long, as well as those semi-commonly-used instructions are up to seven bytes long, are handled by the long decoder.

The long decoder in decode unit 20 only performs one decode per clock cycle, and generates up to four RISC ops. All other translations (complex instructions, interrupts, etc.) are handled by a combination of the vector decoder and RISC op sequences fetched from an on-chip ROM. For complex operations, the vector decoder logic provides the first set of RISC ops and an initial address to a sequence of further RISC ops. The RISC ops fetched from the on-chip ROM are of the same type that are generated by the hardware decoders.

In one embodiment, decode unit 20 generates a group of four RISC ops each clock cycle. For clock cycles in which four RISC ops cannot be generated, decode unit 20 places RISC NOP operations in the remaining slots of the grouping. These groupings of RISC ops (and possible NOPs) are then conveyed to scheduler buffer 32.

It is noted that in another embodiment, an instruction format other than x86 may be stored in instruction cache 14 and subsequently decoded by decode unit 20.

Instruction control logic 34 contains the logic necessary to manage out-of-order execution of instructions stored in scheduler buffer 32. Instruction control logic 34 also manages data forwarding, register renaming, simultaneous issue and retirement of RISC ops, and speculative execution. In one embodiment, scheduler buffer 32 holds up to 24 RISC ops at one time, equating to a maximum of 12x86 instructions. When possible, instruction control logic 34 may simultaneously issue (from buffer 32) a RISC op to any available one of execution units 36. In total, control logic 34 may issue up to six and retire up to four RISC ops per clock cycle in one embodiment.

In one embodiment, microprocessor 10 includes five execution units (36A–E). Store unit 36A and load unit 36B are two-staged pipelined designs. Store unit 36A performs data memory and register writes which are available for loading after one clock cycle. Load unit 36B performs memory reads. The data from these reads is available after two clock cycles. Load and store units are possible in other embodiments with varying latencies.

Execution unit 36C (Integer X unit) is a fixed point execution unit which is configured to operate on all ALU operations, as well as multiplies, divides (both signed and unsigned), shifts, and rotates. In contrast, execution unit 36D (Integer Y unit) is a fixed point execution unit which is configured to operate on the basic word and double word ALU operations (ADD, AND, CMP, etc.).

Execution units 36C and 36D are also configured to accelerate performance of software written using multimedia instructions. Applications that can take advantage of multimedia instructions include graphics, video and audio compression and decompression, speech recognition, and telephony. Units 36C–D are configured to execute multimedia instructions in a single clock cycle in one embodiment. Many of these instructions are designed to perform the same operation of multiple sets of data at once (vector processing). In one embodiment, unit 36C–D uses registers which are mapped on to the stack of floating point unit 36E.

Execution unit 36E contains an IEEE 754-compatible floating point unit designed to accelerate the performance of software which utilizes the x86 instruction set. Floating point software is typically written to manipulate numbers that are either very large or small, require a great deal of precision, or result from complex mathematical operations such as transcendentals. Floating point unit includes an adder unit, a multiplier unit, and a divide/square root unit. In one embodiment, these low-latency units are configured to execute floating point instructions in as few as two clock cycles.

Branch resolution unit 35 is separate from branch prediction logic 22 in that it resolves conditional branches such as JCC and LOOP after the branch condition has been evaluated. Branch resolution unit 35 allows efficient speculative execution, enabling microprocessor 10 to execute instructions beyond conditional branches before knowing whether the branch prediction was correct. As described above, microprocessor 10 is configured to handle up to seven outstanding branches in one embodiment.

Branch prediction logic 22, coupled to decode unit 20, is configured to increase the accuracy with which conditional branches are predicted in microprocessor 10. Ten to twenty percent of the instructions in typical applications include conditional branches. Branch prediction logic 22 is configured to handle this type of program behavior and its negative effects on instruction execution, such as stalls due to delayed instruction fetching. In one embodiment, branch prediction logic 22 includes an 8192-entry branch history table, a 16-entry by 16 byte branch target cache, and a 16-entry return address stack.

Branch prediction logic 22 implements a two-level adaptive history algorithm using the branch history table. This table stores executed branch information, predicts individual branches, and predicts behavior of groups of branches. In one embodiment, the branch history table does not store predicted target addresses in order to save space. These addresses are instead calculated on-the-fly during the decode stage.

To avoid a clock cycle penalty for a cache fetch when a branch is predicted taken, a branch target cache within branch logic 22 supplies the first 16 bytes at that address directly to the instruction buffer (if a hit occurs in the branch target cache). In one embodiment, this branch prediction logic achieves branch prediction rates of over 95%.

Branch logic 22 also includes special circuitry designed to optimize the CALL and RET instructions. This circuitry allows the address of the next instruction following the CALL instruction in memory to be pushed onto a return address stack. When microprocessor 10 encounters a RET instruction, branch logic 22 pops this address from the return stack and begins fetching.

Like instruction cache 14, L1 data cache 26 is also organized as two-way set associative 32 Kbyte storage. In one embodiment, data TLB 28 includes 128 entries used to translate linear to physical addresses. Like instruction cache 14, L1 data cache 26 is also sectored. Data cache 26 implements a MESI (modified-exclusive-shared-invalid) protocol to track cache line status, although other variations are also possible. In order to maximize cache hit rates, microprocessor 10 also includes on-chip L2 cache 40 within the memory sub-system.

Figure 2A:
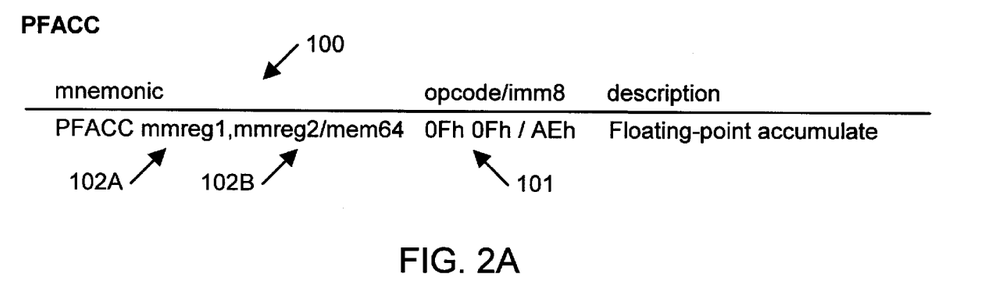
FIGS. 2A–B illustrate the format and operation of an accumulate instruction according to one embodiment of the invention.

Turning now to FIG. 2A, the format of a floating point accumulate instruction ("PFACC") 100 is shown according to one embodiment of the invention. As depicted, PFACC instruction 100 includes an opcode value 101 and two operands, first operand field 102A and first operand field 102B. The value specified by first operand field 102A is shown as being "mmreg1", which, in one embodiment, is one of the registers on the stack of floating point execution unit 36E. The value specified by second operand field 102B is shown as either being another of the floating point stack registers or a memory location ("mmreg2/mem64").

In one embodiment, instruction 100 (and other instructions to be described below with reference to FIGS. 3A, 4A, and 5A) specifies operands (such as the values specified by operand fields 102) having more than one independent value within a given register which is specified as an operand. That is, registers such as mmreg1 specified in FIG. 2A are vector registers.

Figure 6:
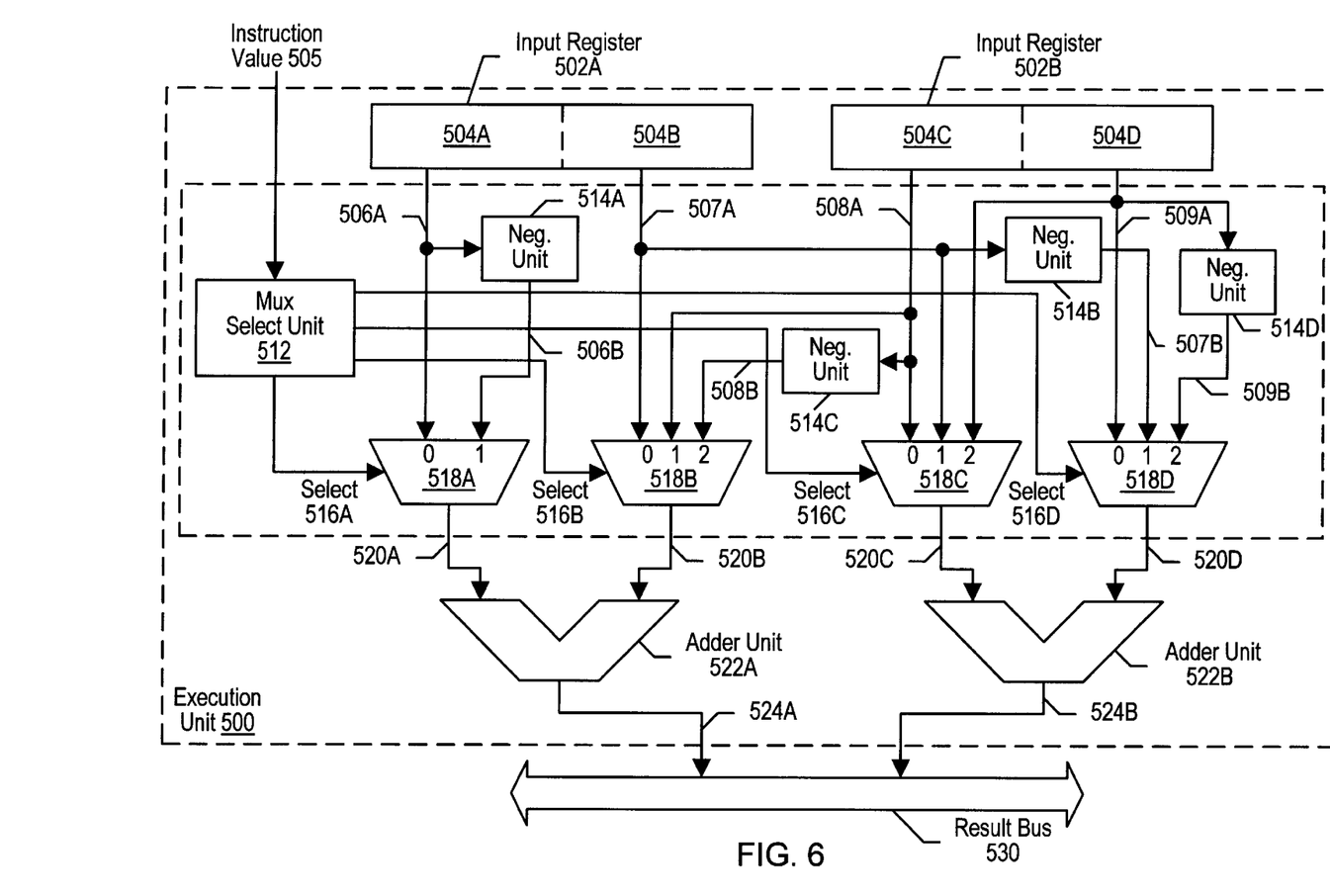
FIG. 6 depicts an execution unit configured to execute the instructions of FIGS. 2–5 according to one embodiment of the invention.

The format of such a register 502A (and 502B) is shown in FIG. 6. Input registers 502A–B each include two separate vector quantities. Register 502A includes first vector input value 504A and second vector value 504B, while register 502B includes third vector input value 504C and fourth vector input value 504D. In one embodiment, all of the floating point registers in execution unit 36E which are accessible by instruction 100 and other instructions described herein are organized in a similar manner. Vector values 504 each include a 32-bit single-precision floating point in one embodiment. In other embodiments, vector values 504 may be stored in other numerical representations, such as a fixed point format.

In one embodiment, the format of the single-precision floating point values stored in registers 502 is the IEEE floating point format. The IEEE format includes a sign bit (S), an exponent value (E), and a significand value (F). The value of a number V represented in IEEE format may thus be represented by $$V=(-1)^{s}*2^{E-bias}*(1.F).$$

Other floating point formats are possible for vector values 504 in other embodiments.

Figure 2B:
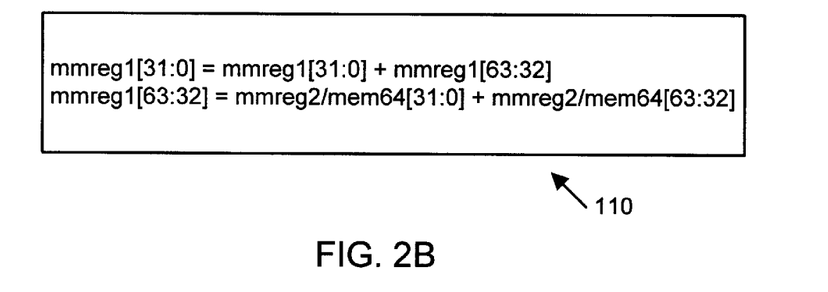

Turning now to FIG. 2B, pseudocode 110 illustrating operation of PFACC instruction 100 is given. As shown, upon execution of PFACC instruction 100, the input values specified by each operand field (i.e., fields 102A and 102B) are individually summed. Specifically, first vector input value 504A and second vector input value 504B are added to produce a first vector output, and third vector input value 504C and fourth vector value 504D are added to produced a second vector output. The first and second vector output values are conveyed to a result bus and are eventually written back to the register specified by operand field 102A ("mmreg1"). The result vector of this and other instructions described below may be written to other storage locations in alternate embodiments. As shown in FIG. 2B, the first vector output is written back to the lower half (mmreg1 [31:0]) of input register 502A, while the second vector output is written to the upper half (mmreg1 [63:32]) of register 502A.

Figure 3A:
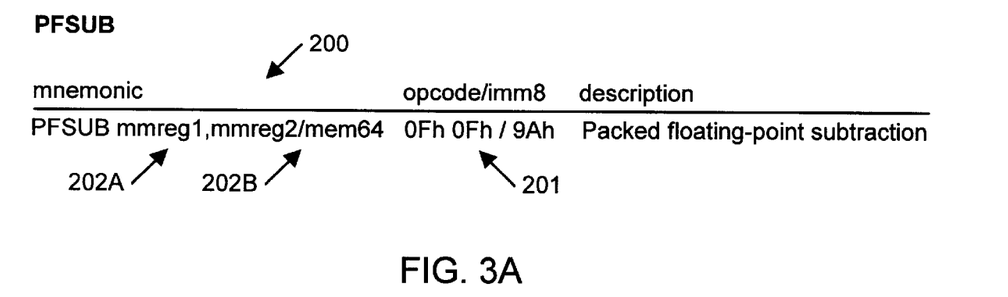
FIGS. 3A–B illustrate the format and operation of a vectored subtract instruction according to one embodiment of the invention.

Turning now to FIG. 3A, the format of a floating-point vectored subtract instruction ("PFSUB") 200 is shown according to one embodiment of the invention. The format of PFSUB instruction 200 is similar to that described above for PFACC instruction 100. As depicted, PFSUB instruction 200 includes an opcode value 201 and two operands, first operand field 202A and second operand field 202B. The value specified by first operand field 202A is shown as being "mmreg1", which, in one embodiment, is one of the registers on the stack of floating point execution unit 36E. The value specified by second operand field 202B is shown as either being another of the floating point stack registers or a memory location ("mmreg2/mem64").

Figure 3B:
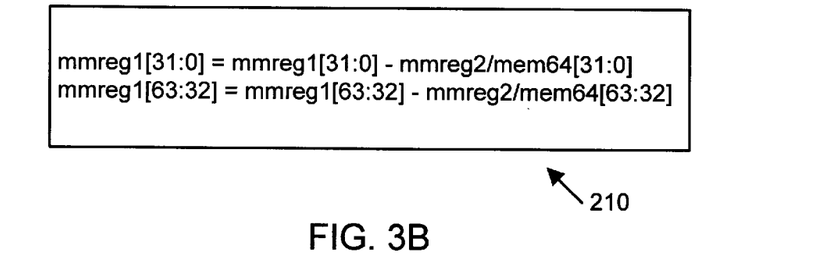

Turning now to FIG. 3B, pseudocode 210 illustrating operation of PFSUB instruction 200 is given. As shown, upon execution of PFSUB instruction 200, a first vector portion (such as value 504C) of the value specified by second operand field 202B is subtracted from a first vector portion of the value (e.g., value 504A) specified by first operand field 202A. In the embodiment shown, this difference value is written back to the upper portion of the value specified by first operand field 202A (mmreg1[63:32]). Concurrently, a second vector portion (such as value 504D) of the value specified by second operand field 202B is subtracted from a second vector portion of the value specified by first operand field 202A. This difference is written to the lower portion of operand 202B (mmreg1 [31:0]).

It is noted that PFSUB instruction 200 utilizes the same operands as PFACC instruction 100. The operands, however, are utilized in different way, however, in order to achieve a different arithmetic operation. As will be shown below, the instructions described with reference to FIGS. 4–5 also utilize the same operands in implementing additional arithmetic operations. FIG. 6 illustrates an efficient implementation of all of these instructions within a single execution unit.

Figure 4A:
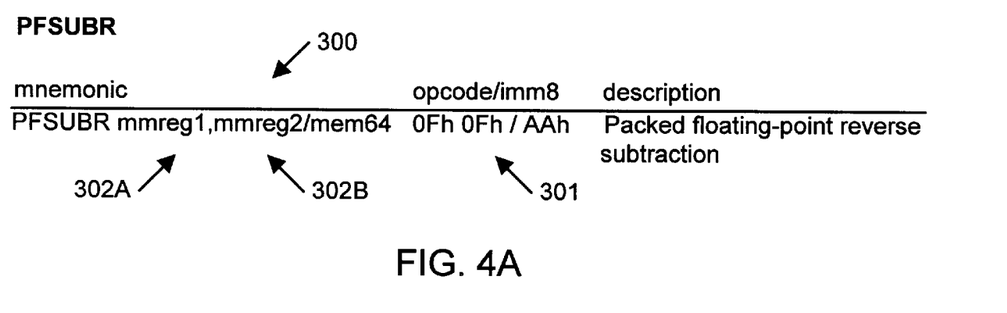
FIGS. 4A–B illustrate the format and operation of a vectored reverse subtract instruction according to one embodiment of the invention.

Turning now to FIG. 4A, the format of a floating-point vectored reverse subtract instruction ("PFSUBR") 300 is shown according to one embodiment of the invention. The format of PFSUBR instruction 300 is similar to that described above for PFSUB instruction 200. As depicted, PFSUBR instruction 300 includes an opcode value 301 and two operands, first operand field 302A and second operand field 302B. The value specified by first operand field 302A is shown as being "mmreg1", which, in one embodiment, is one of the registers on the stack of floating point execution unit 36E. The value specified by second operand field 302B is shown as either being another of the floating point stack registers or a memory location ("mmreg2/mem64").

It is noted that in the embodiment shown, the only difference between PFSUBR instruction 300 and PFSUB instruction 200 is the "direction" of the subtraction. In PFSUB instruction 200, portions of the values specified by operand field 202B are subtracted from corresponding portions of the values specified by operand field 202A. Conversely, in PFSUBR instruction 300, portions of the values specified by operand field 202A are subtracted from the corresponding portions of the values specified by operand field 202B.

Figure 4B:
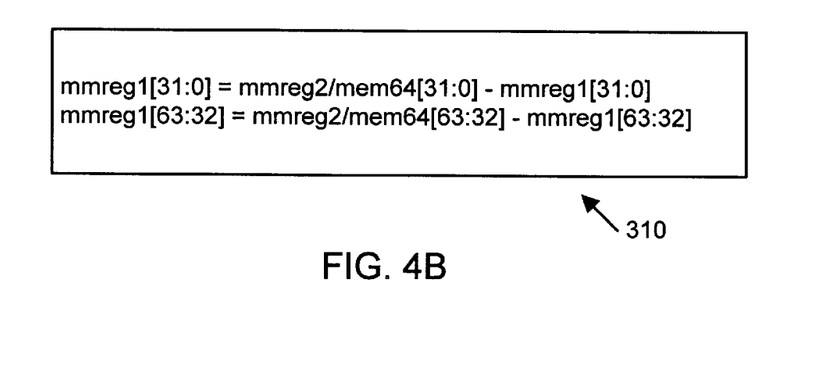

Turning now to FIG. 4B, pseudocode 310 illustrating operation of PFSUBR instruction 300 is given. As shown, upon execution of PFSUBR instruction 300, a first vector portion (such as value 504A) of the value specified by first operand field 302A is subtracted from a first vector portion (e.g., value 504C) of the value specified by second operand field 302B. In the embodiment shown, this difference value is written back to the upper portion of operand 302A (mmreg1[63:32]). Concurrently, a second vector portion of the value specified by first operand field 302A is subtracted from a second vector portion of the value specified by second operand field 302B. This difference is written, in one embodiment, to the lower portion of the location specified by operand 302A (mmreg1[31:0]).

Figure 5A:
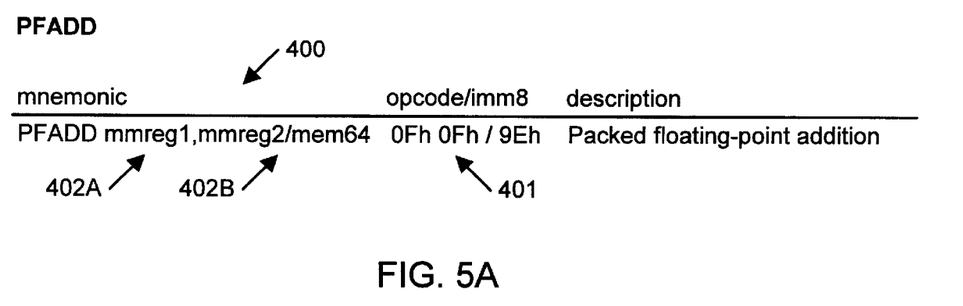
FIGS. 5A–B illustrate the format and operation of a vectored add instruction according to one embodiment of the invention.

Turning now to Fig. 5A, the format of a floating-point vectored add instruction ("PFADD") 400 is shown according to one embodiment of the invention. The format of PFADD instruction 400 is similar to those described above. As depicted, PFADD instruction 400 includes an opcode value 401 and two operands, first operand field 402A and second operand field 402B. The value specified by first operand field 402A is shown as being "mmreg1", which, in one embodiment, is one of the registers on the stack of floating point execution unit 36E. The value specified by second operand field 402B is shown as either being another of the floating point stack registers or a memory location ("mmreg2/mem64").

Figure 5B:
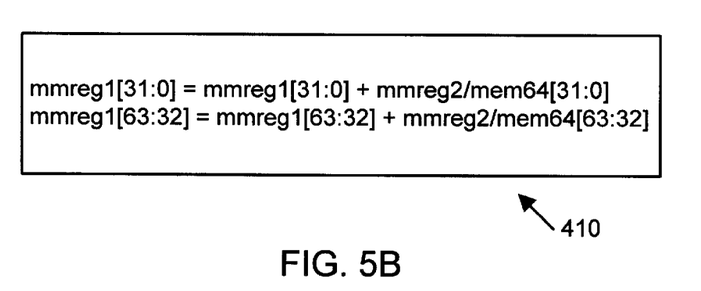

Turning now to FIG. 5B, pseudocode 410 illustrating operation of PFADD instruction 400 is given. As shown, upon execution of PFADD instruction 400, a first vector portion (such as value 504A) of the value specified by first operand field 402A is added to a first vector portion of the value specified by second operand field 402B. In the embodiment shown, this sum is written back to the upper portion of operand 402A (mmreg1[63:32]). Concurrently, a second vector portion of the value specified by first operand field 402A is added to a second vector portion of the value specified by second operand field 402B. This sum is written, in one embodiment, to the lower portion of the location specified by operand 402A (mmreg1[31:0]).

Turning now to FIG. 6, an execution unit 500 is shown according to one embodiment of the invention. Execution unit 500 includes input registers 502A and 502B, each of which includes two vector values. Input register 502A includes first vector input value 504A and second vector input value 504B, while input register 502B includes third vector input value 504C and fourth vector input value 504D. In one embodiment, these are floating-point values represented in IEEE format as described above. Execution unit 500 further includes a multiplexer unit 510, which receives an instruction value 505 and the contents of registers 502A–B. Instruction value 505 is generated from the instruction opcode value in one embodiment. Register 502A values are conveyed to multiplexer unit 510 on buses 506A and 507A, while register 502B values are conveyed on buses 508A and 509A.

Multiplexer unit 510 includes a mux select unit 512, negation units 514A–D, and operand select multiplexers 518A–D. Mux select unit 512 receives opcode value 505, and, in turn, generates a plurality of select signals, 516A–D. Each of select signals 516 corresponds to one of multiplexers 518. Each of multiplexers selects an instruction operand from a plurality of inputs according to the appropriate select signal 516.

Multiplexer 518A receives first vector input value 504A at input "0" via bus 506A. Mux 518A additionally receives a negated version of first vector input value 504A on bus 506B at input "1". This "negated version" is either the one's or two's complement of value 504A, and is generated from first vector input value 504A by negation unit 514A. The output of multiplexer 518A, output 520A, is selected according to the value of select signal 516A and conveyed to an adder unit 522A.

Similarly, multiplexer 518B receives second vector input value 504B at input "0" via bus 507A. Additionally, mux 518B receives third vector input value 504C at input "1", and a negated version of third vector input value 504C at input "2" via bus 508B. The value on bus 508B is generated by negation unit 514C from the third vector input value 504C on bus 508A. A select signal 516B is used to select the output of mux 518B, which is also conveyed to adder unit 522A.

Multiplexer 518C also receives three inputs: third vector input value 504C (on bus 508A at input "0"), second vector input value 504B (on bus 507A at input "1"), and fourth vector input value 504D (on bus 509A at input "2"). The output of multiplexer 518C, output 520C, is selected in accordance with the value conveyed on select signal 516C. Output value 520C is conveyed to an adder unit 522B.

Finally, multiplexer 518D receives fourth vector input value 504D at input "0" on bus 509A. Mux 518D also receives a negated version of second vector input value 504B and fourth vector input value 504D at inputs "1" and "2", respectively. The negated version of value 504B is generated by negation unit 514B from the value on bus 507A, and conveyed to mux 518D on bus 507B. Similarly, the negated version of value 504D is generated by negation unit 514D from the value on bus 509A, and conveyed to mux 518D on bus 509B. The output of multiplexer 518D, output 520D, is selected in accordance with select signal 516D, and conveyed to adder unit 522B.

Mux select unit 512 is configured to generate select signals 516A–D in accordance with opcode value 505. Execution unit 500, which is configured to execute instructions 100, 200, 300, and 400 described above, generates select signal 516 in order to achieve the appropriate routing of operand values to adder units 522. The values of select signals for these instructions is shown according to one embodiment in Table 1 below. It is noted that many other embodiments of multiplexer unit 510 are possible, causing the values in Table 1 to differ.

TABLE 1

| Opcode | Select 516A | Select 516B | Select 516C | Select 516D |
|--------|-------------|-------------|-------------|-------------|
| PFACC  | 0 | 0 | 0 | 0 |
| PFSUB  | 0 | 2 | 1 | 2 |
| PFSUBR | 1 | 1 | 2 | 1 |
| PFADD  | 0 | 1 | 1 | 0 |

Adder units 522 are each configured to perform an addition operation on the two operands conveyed to the adder as inputs. A subtraction operation may be performed with these two inputs if one of the inputs is represented in one's or two's complement form. In the embodiment shown, negation units 514A–D are configured to generate the two's complement (which includes generating a one's complement value and adding one to the result). Addition of two's complement includes adding the sign bits as well (and also adding the carry out of the addends). If the resultant sign bit is 1, then, the output of adder units 522 is a negative number represented in two's complement form. If the sign bit is 0, the result is positive and the result is not in two's complement form.

If negation units 514 are configured to generate a one's complement format, correction is performed in certain cases for the addends to adder units 522. If both addends to an adder unit 522 are negative, for example, 1 is added to the LSB of the adder inputs to achieve the correct result. Additionally, if one addend is negative and has a smaller absolute value than the second (positive) addend, the carry-out from the sign bit is added to the LSB of the adder inputs in order to obtain the correct output.

Adder units 522A and 522B generate vector outputs 524A and 524B, respectively. Outputs 524 are conveyed onto a result bus 530 for storage to a register file (not shown in FIG. 6 for simplicity). In one embodiment, results 524 are subsequently written back to input register 502A.

Figure 7A:
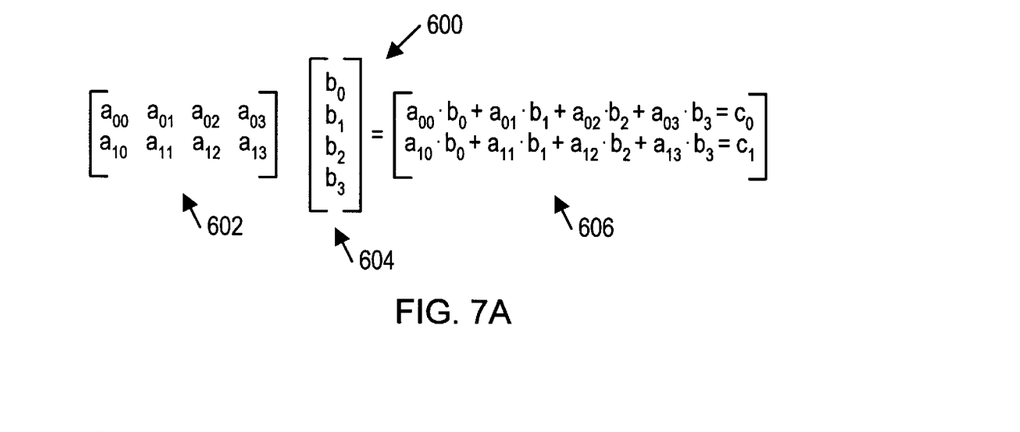
FIG. 7A illustrates an example of a matrix multiply operation.

Turning now to FIG. 7A, an equation 600 is shown which depicts a matrix multiply operation, which is common in many graphics processing applications. Equation 600 includes a 2×4 matrix 602, a 4×1 matrix 604, and a 2×1 result matrix 606. Each element in result matrix is shown both as a single variable ($c_0$, $c_1$) and as a sum of products.

Figure 7B:
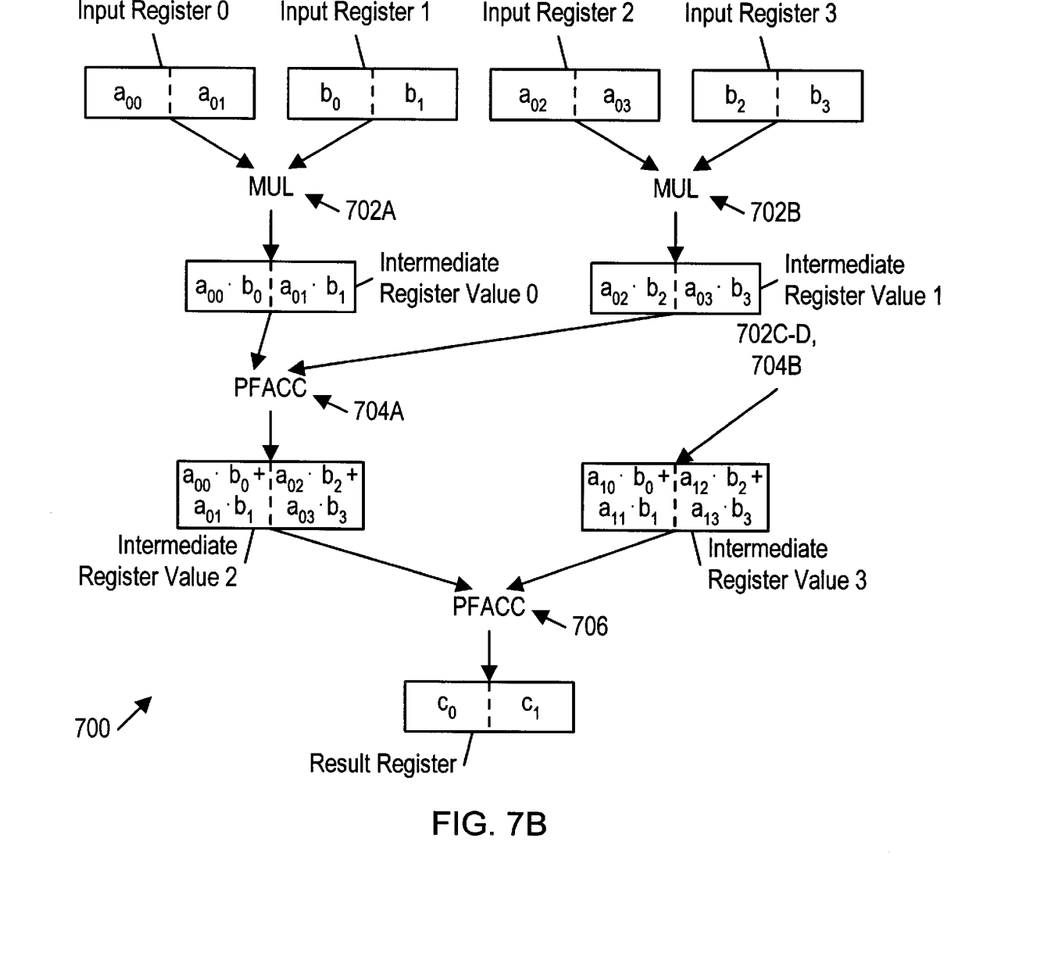
FIG. 7B depicts a method for performing the matrix multiply operation using the accumulate instruction of FIG. 2A according to one embodiment of the invention.

Turning now to FIG. 7B, a method 700 is shown for performing the matrix multiply operation according to one embodiment of the invention. Method 700 first includes a step 702A, in which a vectored multiply operation is performed on the values in input registers 0 and 1. The result of the multiply operation in step 702A is represented as two separate values, $a_{00} \cdot b_0$ and $a_{01} \cdot b_1$. Method 700 further includes a step 702B, performed concurrently with step 702A in one embodiment, in which the vectored multiply operation is performed on the values in input registers 2 and 3. Step 702B produces intermediate register value 1, which includes the products $a_{02} \cdot b_2$ and $a_{03} \cdot b_3$.

Next, in step 704A, PFACC instruction 100 is performed on the values in intermediate register values 0 and 1. This instruction results in a sum of products as represented in intermediate register value 2. Although not explicitly shown in FIG. 7B, steps 702C–D and 704B produce the sums of products as represented in intermediate register value 3. Steps 704C and 704D are vector multiply operations analogous to steps 702A–B, while step 704B is a PFACC instruction performed on the results of steps 704C–D.

Method 700 finally includes a step 706, in which another PFACC instruction 100 is performed using intermediate register values 2 and 3 as operands. The result in the upper half of the result register is $c_0$, with $c_1$ being written to the bottom half.

The use of PFACC instruction allows a simple, effective means of performing the matrix multiply operation. Furthermore, by using execution unit 500, this instruction may be utilized with minimal additional overhead above that required for instructions 200, 300, and 400.

Figure 8:
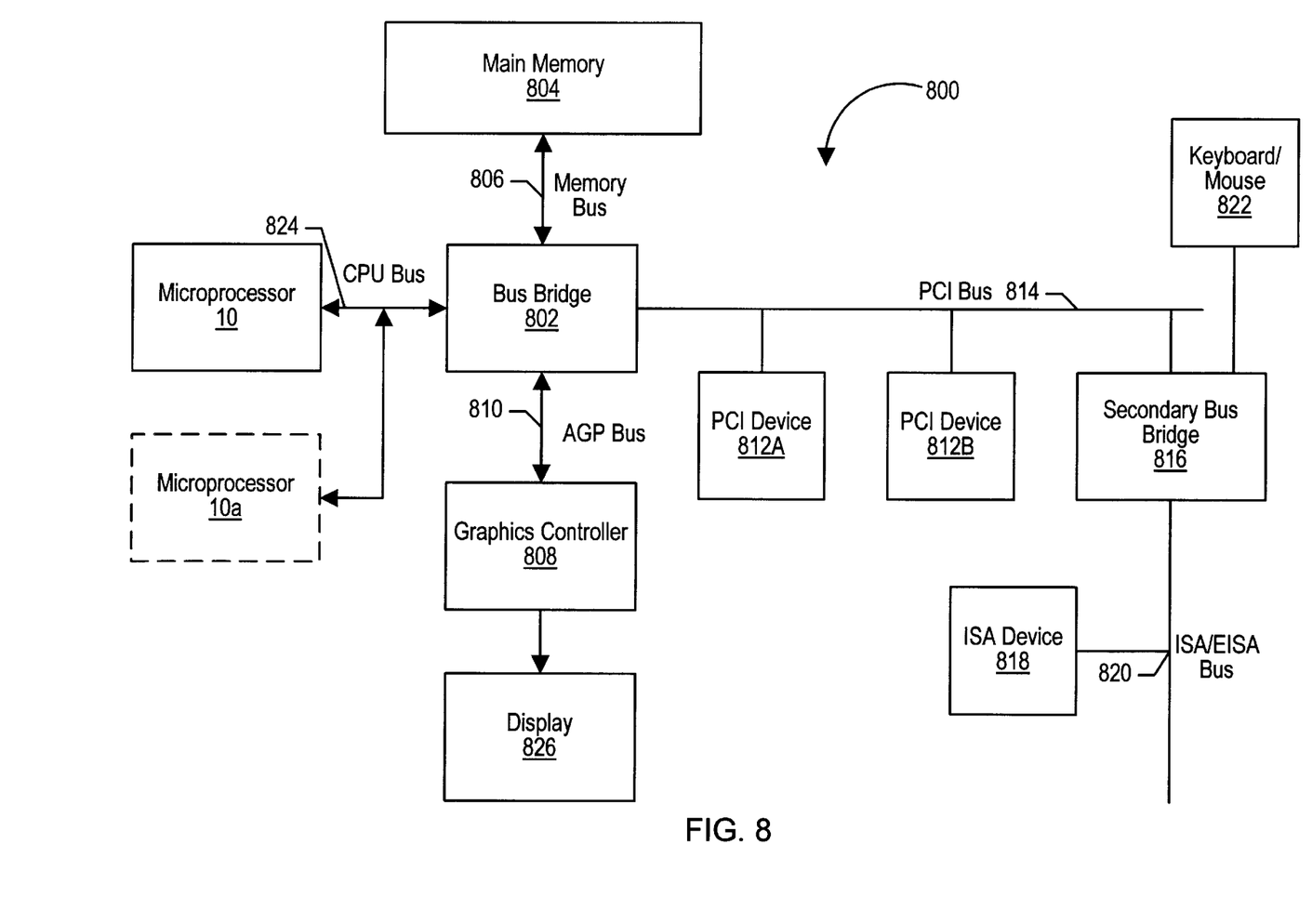
FIG. 8 depicts a computer system which includes a microprocessor according one embodiment of the invention.

Turning now to FIG. 8, a block diagram of one embodiment of a computer system 800 including microprocessor 10 coupled to a variety of system components through a bus bridge 802 is shown. Other embodiments are possible and contemplated. In the depicted system, a main memory 804 is coupled to bus bridge 802 through a memory bus 806, and a graphics controller 808 is coupled to bus bridge 802 through an AGP bus 810. Finally, a plurality of PCI devices 812A–812B are coupled to bus bridge 802 through a PCI bus 814. A secondary bus bridge 816 may further be provided to accommodate an electrical interface to one or more EISA or ISA devices 818 through an EISA/ISA bus 820. Microprocessor 10 is coupled to bus bridge 802 through a CPU bus 824.

Bus bridge 802 provides an interface between microprocessor 10, main memory 804, graphics controller 808, and devices attached to PCI bus 814. When an operation is received from one of the devices connected to bus bridge 802, bus bridge 802 identifies the target of the operation (e.g. a particular device or, in the case of PCI bus 814, that the target is on PCI bus 814). Bus bridge 802 routes the operation to the targeted device. Bus bridge 802 generally translates an operation from the protocol used by the source device or bus to the protocol used by the target device or bus.

In addition to providing an interface to an ISA/EISA bus for PCI bus 814, secondary bus bridge 816 may further incorporate additional functionality, as desired. For example, in one embodiment, secondary bus bridge 816 includes a master PCI arbiter (not shown) for arbitrating ownership of PCI bus 814. An input/output controller (not shown), either external from or integrated with secondary bus bridge 816, may also be included within computer system 800 to provide operational support for a keyboard and mouse 822 and for various serial and parallel ports, as desired. An external cache unit (not shown) may further be coupled to CPU bus 824 between microprocessor 10 and bus bridge 802 in other embodiments. Alternatively, the external cache may be coupled to bus bridge 802 and cache control logic for the external cache may be integrated into bus bridge 802.

Main memory 804 is a memory in which application programs are stored and from which microprocessor 10 primarily executes. A suitable main memory 804 comprises DRAM (Dynamic Random Access Memory), and preferably a plurality of banks of SDRAM (Synchronous DRAM).

PCI devices 812A–812B are illustrative of a variety of peripheral devices such as, for example, network interface cards, video accelerators, audio cards, hard or floppy disk drives or drive controllers, SCSI (Small Computer Systems Interface) adapters and telephony cards. Similarly, ISA device 818 is illustrative of various types of peripheral devices, such as a modem, a sound card, and a variety of data acquisition cards such as GPIB or field bus interface cards.

Graphics controller 808 is provided to control the rendering of text and images on a display 826. Graphics controller 808 may embody a typical graphics accelerator generally known in the art to render three-dimensional data structures which can be effectively shifted into and from main memory 804. Graphics controller 808 may therefore be a master of AGP bus 810 in that it can request and receive access to a target interface within bus bridge 802 to thereby obtain access to main memory 804. A dedicated graphics bus accommodates rapid retrieval of data from main memory 804. For certain operations, graphics controller 808 may further be configured to generate PCI protocol transactions on AGP bus 810. The AGP interface of bus bridge 802 may thus include functionality to support both AGP protocol transactions as well as PCI protocol target and initiator transactions. Display 826 is any electronic display upon which an image or text can be presented. A suitable display 826 includes a cathode ray tube ("CRT"), a liquid crystal display ("LCD"), etc.

It is noted that, while the AGP, PCI, and ISA or EISA buses have been used as examples in the above description, any bus architectures may be substituted as desired. It is further noted that computer system 800 may be a multiprocessing computer system including additional microprocessors (e.g. microprocessor 10a shown as an optional component of computer system 800). Microprocessor 10a may be similar to microprocessor 10. More particularly, microprocessor 10a may be an identical copy of microprocessor 10. Microprocessor 10a may share CPU bus 824 with microprocessor 10 (as shown in FIG. 8) or may be connected to bus bridge 802 via an independent bus.

Numerous variations and modifications will become apparent to those skilled in the art once the above disclosure is fully appreciated. It is intended that the following claims be interpreted to embrace all such variations and modifications.

What is claimed is:

1. An execution unit in a microprocessor, comprising:
   a first input register configured to store a first plurality of vector input values;
   a second input register configured to store a second plurality of vector input values;
   a multiplexer unit coupled to receive an instruction value indicative of one of a first plurality of instructions, said first plurality of vector input values, and said second plurality of vector input values, wherein said multiplexer unit is configured to generate a first plurality of multiplexer output values and a second plurality of multiplexer output values from said first plurality of vector input values and said second plurality of vector input values according to said instruction value;
   a first adder unit configured to receive said first plurality of multiplexer output values, wherein said first adder unit is configured to generate a first vector output value by adding said first plurality of multiplexer output values;
   a second adder unit configured to receive said second plurality of multiplexer output units, wherein said second adder unit is configured to generate a second vector output value by adding said second plurality of multiplexer output units;
   wherein said first plurality of instructions includes an accumulate instruction having a first instruction value, and wherein said multiplexer unit is configured to route said first plurality of vector input values to said first adder unit and said second plurality of vector input values to said second adder unit in response to receiving said first instruction value;
   wherein said first plurality of vector input values includes a first vector input value and a second vector input value.

2. The execution unit of claim 1, wherein said second plurality of vector input values includes a third vector input value and a fourth vector input value.

3. The execution unit of claim 2, wherein said multiplexer unit is coupled to receive said first vector input value, said second vector input value, said third vector input value, and said fourth vector input value.

4. The execution unit of claim 3, wherein, in response to receiving said first instruction value, said multiplexer unit is configured to route said first vector input value and said second vector input value to said first adder unit as said first plurality of multiplexer output values, and wherein said multiplexer unit is further configured to route said third vector input value and said fourth vector input value to said second adder unit as said second plurality of multiplexer output values.

5. The execution unit of claim 4, wherein said first plurality of instructions includes a subtract instruction having a second instruction value, wherein said subtract instruction is executable to subtract corresponding vector input values of said first input register and second input register.

6. The execution unit of claim 5, wherein, in response to receiving said second instruction value, said multiplexer unit is configured to route said first vector input value and a negated version of said third vector input value to said first adder unit as said first plurality of multiplexer output values, and wherein said multiplexer unit is further configured to route said second vector input value and a negated version of said fourth vector input value to said second adder unit as said second plurality of multiplexer output values.

7. The execution unit of claim 6, wherein said first plurality of instructions includes a reverse subtract instruction having a third instruction value, wherein said reverse subtract instruction is executable to reverse subtract corresponding vector input values of said first input register and said second input register.

8. The execution unit of claim 7, wherein, in response to receiving said third instruction value, said multiplexer unit is configured to route a negated version of said first vector input value and said third vector input value to said first adder unit as said first plurality of multiplexer output values, and wherein said multiplexer unit is further configured to route a negated version of said second vector input value and said fourth vector input value to said second adder unit as said second plurality of multiplexer output values.

9. The execution unit of claim 8, wherein said first plurality of instructions includes an add instruction having a fourth instruction value, wherein said add instruction is executable to add corresponding vector input values of said first input register and said second input register.

10. The execution unit of claim 9, wherein, in response to receiving said fourth instruction value, said multiplexer unit is configured to route said first vector input value and said third vector input value to said first adder unit as said first plurality of multiplexer output values, and wherein said multiplexer unit is further configured to route said second vector input value and said fourth vector input value to said second adder unit as said second plurality of multiplexer output values.

11. The execution unit of claim 1, wherein said first input register is configured to store said first vector output value and said second vector output value.

12. The execution unit of claim 1, wherein said first plurality of instructions include variable-length instructions.

13. The execution unit of claim 1, wherein said first plurality of instructions include x86 instructions.

14. An execution unit in a microprocessor, comprising:
   a first input register configured to store a first plurality of vector input values;
   a second input register configured to store a second plurality of vector input values;
   a multiplexer unit coupled to receive an instruction value indicative of one of a first plurality of instructions, said first plurality of vector input values, and said second plurality of vector input values, wherein said multiplexer unit is configured to generate a first plurality of multiplexer output values and a second plurality of multiplexer output values from said first plurality of vector input values and said second plurality of vector input values according to said instruction value;
   a first adder unit configured to receive said first plurality of multiplexer output values, wherein said first adder unit is configured to generate a first vector output value by adding said first plurality of multiplexer output values;
   a second adder unit configured to receive said second plurality of multiplexer output units, wherein said second adder unit is configured to generate a second vector output value by adding said second plurality of multiplexer output units;
   wherein said first plurality of instructions includes an accumulate instruction having a first instruction value, and wherein said multiplexer unit is configured to route said first plurality of vector input values to said first adder unit and said second plurality of vector input values to said second adder unit in response to receiving said first instruction value;

wherein said execution unit is coupled to a result bus to receive said first vector output value and said second vector output value from said first adder unit and said second adder unit, respectively.

15. An execution unit in a microprocessor, comprising:

a first input register configured to store a first plurality of vector input values;

a second input register configured to store a second plurality of vector input values;

a multiplexer unit coupled to receive an instruction value indicative of one of a first plurality of instructions, said first plurality of vector input values, and said second plurality of vector input values, wherein said multiplexer unit is configured to generate a first plurality of multiplexer output values and a second plurality of multiplexer output values from said first plurality of vector input values and said second plurality of vector input values according to said instruction value;

a first adder unit configured to receive said first plurality of multiplexer output values, wherein said first adder unit is configured to generate a first vector output value by adding said first plurality of multiplexer output values;

a second adder unit configured to receive said second plurality of multiplexer output units, wherein said second adder unit is configured to generate a second vector output value by adding said second plurality of multiplexer output units;

wherein said first plurality of instructions includes an accumulate instruction having a first instruction value, and wherein said multiplexer unit is configured to route said first plurality of vector input values to said first adder unit and said second plurality of vector input values to said second adder unit in response to receiving said first instruction value;

wherein said first plurality of vector input values and said second plurality of vector input values are floating-point numbers.

16. A microprocessor configured to perform vector processing operations, comprising:

an execution unit coupled to receive a first plurality of vector input values from a first input register and a second plurality of vector input values from a second input register, wherein said execution unit is further coupled to receive an instruction value indicative of one of a first plurality of instructions, said execution unit including:

a multiplexer unit coupled to receive said first plurality of vector input values and said second plurality of vector input values, wherein said multiplexer unit is configured to generate a first plurality of multiplexer output values and a second plurality of multiplexer output values from said first plurality of vector input values and said second plurality of vector input values according to said instruction value;

a first adder unit configured to receive said first plurality of multiplexer output values, wherein said first adder unit is configured to generate a first vector output value by adding said first plurality of multiplexer output values;

a second adder unit configured to receive said second plurality of multiplexer output units, wherein said second adder unit is configured to generate a second vector output value by adding said second plurality of multiplexer output units;

wherein said first plurality of instructions includes an accumulate instruction having a first instruction value, and wherein said execution unit, in response to receiving said first instruction value, is configured to add together each of said first plurality of vector input values in order to generate said first vector output value and is further configured to add together each of said second plurality of vector input values in order to generate said second vector output value.

17. The microprocessor of claim 16, further comprising a result bus coupled to receive said first vector output value and said second vector output value from said first adder unit and said second adder unit, respectively.

18. The microprocessor of claim 16, wherein said first plurality of instructions includes a subtract instruction having a second instruction value, and wherein said execution unit, in response to receiving said second instruction value, is configured to add a negated version of a first of said second plurality of vector input values to a first of said first plurality of vector input values in order to generate said first vector output value, and is further configured to add a negated version of a second of said second plurality of vector input values to a second of said first plurality of vector input values in order to generate said second vector output value.

19. The microprocessor of claim 18, wherein said first plurality of instructions includes a reverse subtract instruction having a third instruction value, and wherein said execution unit, in response to receiving said third instruction value, is configured to add a negated version of said first of said first plurality of vector input values to said first of said second plurality of vector input values in order to generate said first vector output value, and is further configured to add a negated version of said second of said first plurality of vector input values to said second of said second plurality of vector input values in order to generate said second vector output value.

20. The microprocessor of claim 19, wherein said first plurality of instructions includes an add instruction having a fourth instruction value, and wherein said execution unit, in response to receiving said fourth instruction value, is configured to add said first of said first plurality of vector input values to said first of said second plurality of vector input values in order to generate said first vector output value, and is further configured to add said second of said first plurality of vector input values to said second of said second plurality of vector input values in order to generate said second vector output value.

21. The microprocessor of claim 19, wherein said multiplexer unit includes a plurality of negation units configured to generate negated versions of said first plurality of vector input values and said second plurality of vector input values for use in implementing said subtract instruction and said reverse subtract instruction.

22. The microprocessor of claim 16, wherein said first plurality of vector input values and said second plurality of vector input values are floating-point numbers.

23. The microprocessor of claim 16, wherein said first input register is configured to store said first vector output value and said second vector output value.

24. The execution unit of claim 16, wherein said first plurality of instructions include variable-length instructions.

25. The execution unit of claim 16, wherein said first plurality of instructions include x86 instructions.

26. A method for executing one of a plurality of vector processing instructions in a microprocessor, comprising:

conveying a first plurality of vector input values from a first input register to an execution unit configured to execute said plurality of vector processing instructions;

conveying a second plurality of vector input values from a second input register to said execution unit;

conveying a particular instruction value to said execution unit, wherein said particular instruction value is indicative of one of said plurality of vector processing instructions;

generating first adder input values and second adder input values from selected ones of said first plurality of vector input values and said second plurality of vector input values, wherein said generating is performed in accordance with said particular instruction value;

adding said first adder input values in a first adder unit in order to generate a first vector output value;

adding said second adder input values in a second adder unit in order to generate a second vector output value;

wherein a first of said plurality of vector processing instructions is an accumulate instruction having a first instruction value, and wherein, in response to said particular instruction value being said first instruction value, said generating includes routing said first plurality of vector input values to said first adder unit as said first adder input values and routing said second plurality of vector input values to said second adder unit as said second adder input values.

27. The method of claim 26, wherein said generating includes producing negated versions of said first plurality of vector input values and said second plurality of vector input values.

28. The method of claim 27, wherein a second of said vector processing instructions is a subtract instruction having a second instruction value, and wherein, in response to said particular instruction value being said second instruction value, said generating includes routing a first of said first plurality of vector input values and a negated version of a first of said second plurality of vector input values to said first adder unit as said first adder input values and routing a second of said first plurality of vector input values and a negated version of a second of said second plurality of vector input values to said second adder unit as said second adder input values.

29. The method of claim 28, wherein a third of said vector processing instructions is a reverse subtract instruction having a third instruction value, and wherein, in response to said particular instruction value being said third instruction value, said generating includes routing a first of said second plurality of vector input values and a negated version of a first of said first plurality of vector input values to said first adder unit as said first adder input values and routing a second of said second plurality of vector input values and a negated version of a second of said first plurality of vector input values to said second adder unit as said second adder input values.

30. The method of claim 29, wherein a fourth of said vector processing instructions is an add instruction having a fourth instruction value, and wherein, in response to said particular instruction value being said fourth instruction value, said generating includes routing a first of said first plurality of vector input values and a first of said second plurality of vector input values to said first adder unit as said first adder input values and routing a second of said first plurality of vector input values and a second of said second plurality of vector input values to said second adder unit as said second adder input values.

31. The method of claim 26, further comprising:

storing said first vector output value and said second vector output value in said first input register.

* * * * *